United States Patent [19]

Gabara

[11] Patent Number: 5,311,084
[45] Date of Patent: May 10, 1994

[54] INTEGRATED CIRCUIT BUFFER WITH CONTROLLED RISE/FALL TIME

[75] Inventor: Thaddeus J. Gabara, Murray Hill, N.J.

[73] Assignee: AT&T Bell Laboratories, Murray Hill, N.J.

[21] Appl. No.: 902,614

[22] Filed: Jun. 23, 1992

[51] Int. Cl.[5] .................. H03F 1/30; H03K 17/14
[52] U.S. Cl. .................. 307/491; 307/571; 307/263
[58] Field of Search .................. 307/263, 296.4, 296.5, 307/443, 491, 494, 571, 253

[56] References Cited

U.S. PATENT DOCUMENTS

| | | | |
|---|---|---|---|
| 4,563,595 | 1/1986 | Bose | 307/290 |
| 4,567,378 | 1/1986 | Raver | |
| 4,782,252 | 12/1987 | Levy et al. | 307/576 |
| 4,820,937 | 4/1989 | Hsieh | 307/264 |
| 4,823,029 | 4/1989 | Gabara | |
| 4,972,101 | 9/1989 | Partovi et al. | 307/443 |
| 5,021,684 | 6/1991 | Ahuja et al. | 307/546 |
| 5,061,863 | 10/1991 | Mori et al. | 307/299.2 |
| 5,099,138 | 3/1992 | Fukunaga | 307/571 |
| 5,214,320 | 5/1993 | Truong | 307/263 |

FOREIGN PATENT DOCUMENTS

WO89/03614 4/1989 World Int. Prop. O. .... H03K 17/16
WO91/20129 12/1991 World Int. Prop. O. .... H03K 19/003

OTHER PUBLICATIONS

European Search Report dated Oct. 4, 1993, 3 pages.

*Primary Examiner*—John Zazworsky
*Attorney, Agent, or Firm*—James H. Fox

[57] ABSTRACT

Process, voltage, and temperature variations affect the noise generation of an output buffer. Controlling the switching speed of the buffer over these variations also controls the buffer noise, which may be due to ground bounce or other reasons. In one prior-art technique, the current flow behavior of a static circuit is used to control the rise and/or fall times of the output buffer. However, accounting for all possible variations in the factors that influence the switching speed is difficult with a static control circuit. In the inventive technique, the AC switching behavior of a scaled-down buffer that is driven by a periodic signal generates the control voltage. In this manner, the factors that influence buffer switching speed, including process, voltage, and temperature variations, may be more accurately accounted for.

22 Claims, 3 Drawing Sheets

INTEGRATED CIRCUIT BUFFER WITH CONTROLLED RISE/FALL TIME

BACKGROUND OF THE INVENTION

1. Field of the Invention

The present invention relates to an integrated circuit having one or more buffers.

2. Description of the Prior Art

An integrated circuit (IC) typically communicates to external devices through electrical conductors driven by output buffers. Another type of buffer, referred to as a "clock driver", is used to distribute clock signals. The clock driver in some cases is located on the same integrated circuit as the circuitry that receives the clock signals. For either on-chip or off-chip drive applications, a buffer is designed to provide adequate current drive capability to charge and discharge the capacitive load presented by the driven conductors (and driven circuitry) at a sufficiently fast rate to allow signals to be sent at the desired speed. The speed at which a buffer can raise a voltage from a low logic level (typically 0 volts) to a high logic level (typically 3 or 5 volts) is referred to as the "rise time". Similarly, the speed at which the buffer can reduce the voltage from high to low levels is the "fall time". With CMOS integrated circuits, the speed of data communications to external devices presently ranges up to several tens of million bits per second, with increases to over one hundred million bits per second likely in the near future. Therefore, the rise and fall times are typically required to be less than about 10 nanoseconds at present, with significant reductions required for the future.

One problem associated with signals having rapid rise and fall times is the electrical noise they produce in other parts of the integrated circuit. That is, stray capacitance and inductance cause some of the signal energy to couple to other portions of the integrated circuit, or to other conductors external to the IC. In addition, inductance in the ground path causes voltage spikes to appear due to rapid current variations caused by the switching of large buffers. These problems generally become more severe as the rise and fall times become shorter. In most cases, integrated circuit buffers are designed so that the rise and fall times are sufficiently fast to drive the load under worst case conditions. For CMOS integrated circuits, the worst case conditions are slower than nominal process speeds, low power supply voltages, and high operating temperatures. However, under the best case conditions, the rise and fall times may then be so short as to generate excessive noise. The "process speed" refers to the fact that due to the tolerances for a given IC production process, some IC's turn out to be "fast", and others "slow", as compared to IC's produced by an average or nominal process. That is, a given production run may produce devices that switch signals more quickly than average, being referred to as a "fast" process, and vice-versa for a "slow" process. Hence, a buffer design that satisfies the speed requirements may violate the noise requirements, and vice-versa.

It is desirable to have an integrated circuit that generates low noise while having the ability to communicate at a sufficiently high data rate over conductors and other circuitry presenting a significant capacitive load. One technique for controlling buffer switching speed, and hence the noise produced, is shown in FIG. 1. The pre-driver transistors 102 and 103 supply a drive signal to pull-up output transistor 100, whereas pre-driver transistors 106 and 107 supply a drive signal to pull-down output transistor 101. A control voltage VCP increases when factors such as process speed, temperature, and power supply voltage (for example) tend to increase the switching speed. This increase of VCP reduces the gate-to-source voltage, and hence the conductivity, of the p-channel transistor 105, thereby reducing the drive signal to output transistor 101, which controls the buffer fall time. Inversely, the voltage VCP decreases, so as to increase the conductivity of transistor 105, when these factors tend to decrease the switching speed. (The control voltage VCN is generated so as to similarly affect the conductivity of the n-channel transistor 104, thereby controlling the drive to the output transistor 100, and hence the buffer rise time.) In this manner, the buffer switching speed, and hence noise, is held more constant with respect to variations in these factors. The output load driven by this buffer is shown as capacitance $C_{load}$.

One method of generating the control voltages VCP and VCN is shown in U.S. Pat. No. 4,823,029, co-assigned herewith. The type of static circuits for generating the control voltages as shown in FIGS. 2 through 5 therein are successful in many applications. However, accounting for all possible variations in the factors that influence the switching speed is difficult when a static circuit is used to generate the DC control voltage. Another method of controlling an output buffer is shown in U.S. Pat. No. 4,567,378, wherein the buffer output signal is compared to the output of a ramp generator. If the output signal rises or falls faster than the ramp signal, then a feedback signal adjusts the speed of the buffer to more closely correspond to the ramp signal. However, that technique monitors the output signal at each buffer, which requires extra monitor circuitry for each buffer, and ramp circuitry for each buffer.

SUMMARY OF THE INVENTION

I have invented a technique for generating the control voltage that is used to control the rise and/or fall time of an integrated circuit buffer, including for example, output buffers and clock drivers. In the inventive technique, a reference buffer driven by a periodic signal mimics the performance of a given buffer that drives a desired load. The reference buffer produces a periodic signal that is sampled during the switching of the reference buffer. The sampled signal is used to generate a control signal that maintains more constant the speed of the given buffer that drives the actual load. One or more buffers may be controlled from a control signal generated by a single reference circuit.

DETAILED DESCRIPTION

The present detailed description relates to an integrated circuit buffer having a control voltage generated by sampling the waveform of a reference buffer that is driven by a periodic (e.g., clock) signal. In an illustrative embodiment, the sampled signal, typically a voltage, is compared to a reference signal, also typically a voltage. The comparison produces a control signal that is fed back so as to cause the sampled signal from the reference buffer to reach a steady-state value. The control signal is used to control the rise time, or fall time, or both, of the buffer that drives the desired load. In this manner, a more constant speed of operation of the buffer is obtained. Since the drive signal to the reference buffer is independent of the drive to the actual buffer driving the desired load, more than one buffer may be controlled by a single reference buffer.

Figure 1:
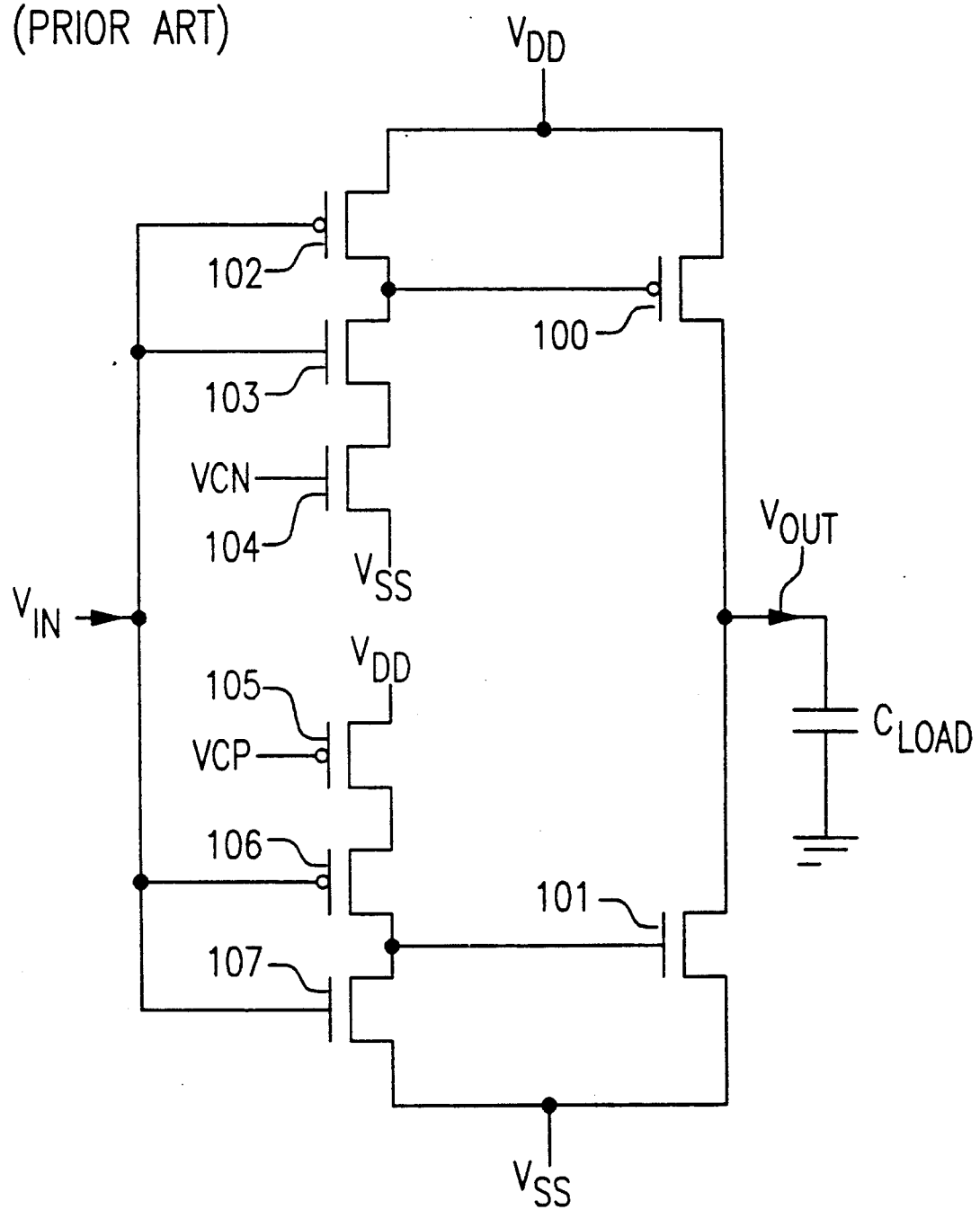
FIG. 1 shows a typical prior-art voltage-controlled buffer.
Figure 2:
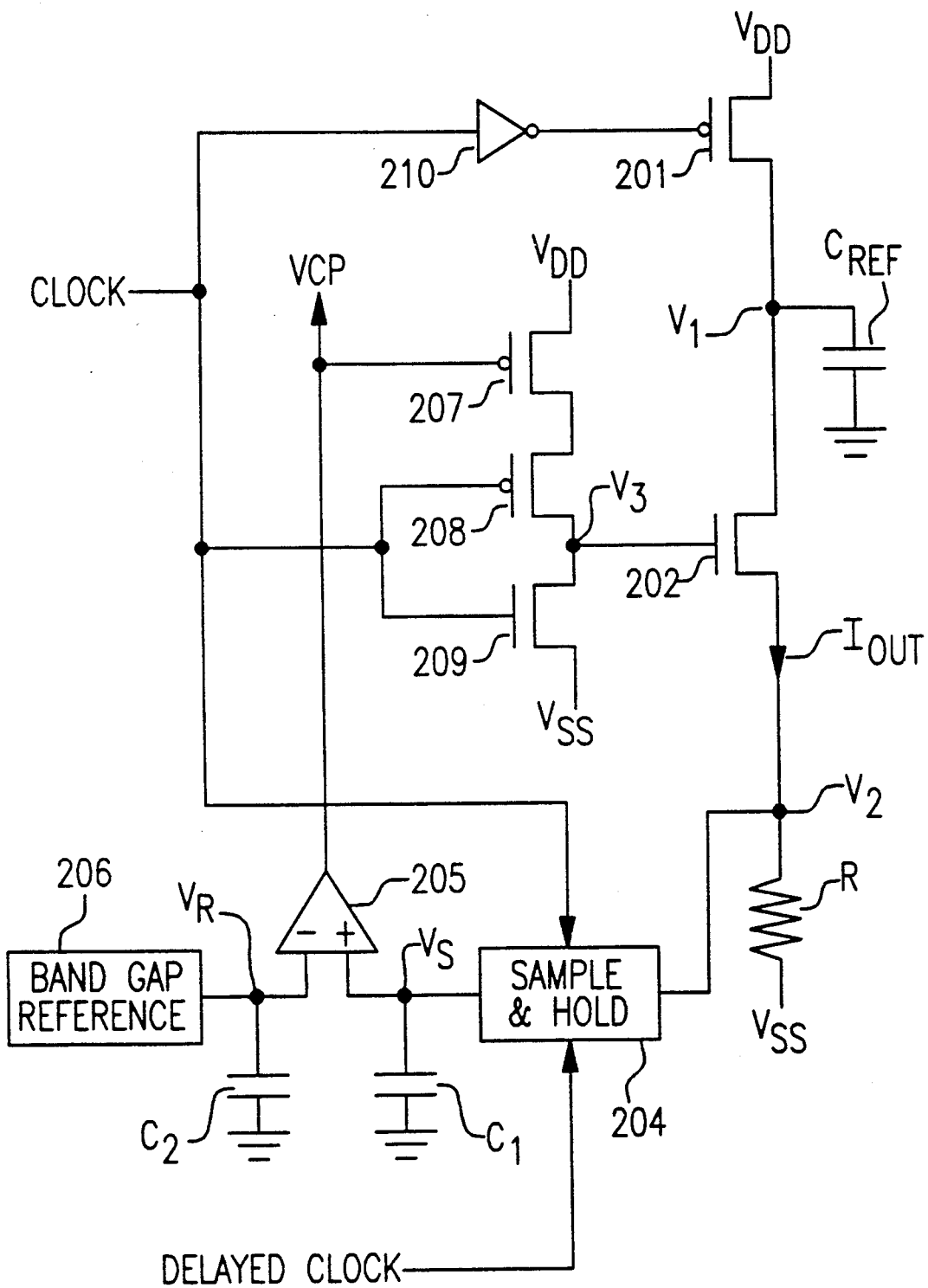
FIG. 2 shows an illustrative embodiment of the present invention.

Referring to FIG. 2, an exemplary reference buffer and sampling circuitry are shown. When the CLOCK signal goes high, the output of inverter 210 goes low, thereby causing p-channel pull-up transistor 201 to conduct. This conduction charges up reference capacitor $C_{ref}$ to a fixed high value, such that the voltage $V_1$ initially approximates $V_{DD}$. When the CLOCK signal goes low, the output of inverter 210 goes high, causing transistor 201 to cease conduction. Also, the output of inverter pair 208-209 ($V_3$) goes high, causing n-channel pull-down transistor 202 to conduct. The conduction through transistor 202 tends to discharge $C_{ref}$, by allowing the current $I_{out}$ to flow through an impendance, which in the illustrative case is a resistor R. The voltage $V_2$ across resistor R is sampled by sample-and-hold circuit 204 at a time that is delayed with respect to the time the CLOCK signal goes low. Therefore, the sampled value of $V_2$ contains information about how quickly capacitor $C_{ref}$ is discharged, which in turn relates to the speed of transistor 202. This information is used to generate the control signal VCP which controls the fall time of the buffer shown in FIG. 1.

The sample-and hold circuit 204 is shown in more detail in FIG. 3, and operates as follows: The CLOCK signal is delayed by inverters 301 . . . 304 and applied to a phase splitter 305, being a design well known in the art. When the CLOCK is high, the voltages $V_4$ and $\overline{V}_4$ are high and low, respectively, allowing pass transistors 306 and 307 to conduct. Therefore, the voltage $V_2$ is applied to capacitor 308 during the "sample" period. When the CLOCK signal goes low, the pass transistors 306 and 307 are turned off after the delay period (DELAY I) through inverters 301 . . . 304, thereby causing capacitor 308 to "hold" the most recent sample value of $V_2$. The delay through inverters 301 . . . 304 is chosen to delay sampling of the voltage $V_2$ until reference capacitor $C_{ref}$ (FIG. 2) has partially discharged due to conduction through transistor 202 and resistor R. This held sample value on capacitor 308 is allowed to pass through transistor 309 when the DELAYED CLOCK signal goes high, as follows: The high-going DELAYED CLOCK signal initially passes through NAND gate 311 and inverter 310 to produce a high voltage on the gate of transistor 309, thereby allowing it to conduct. After a delay time period through inverters 312, 313 and 314, the high-going DELAYED CLOCK signal causes the output of gate 311 to go low, thereby terminating this pulse, which illustratively has a width of about 1 nanosecond. In this manner, the sampled voltage $V_S$ is placed on capacitor $C_1$ (FIG. 2).

Referring again to FIG. 2, the sampled voltage $V_S$ on $C_1$ is supplied to the non-inverting input of operational amplifier 205. The inverting input of operational amplifier 205 is connected to $C_2$ and a reference voltage source 206. The capacitors $C_1$ and $C_2$ have an exemplary value of 40 picofarads. In operation, the sampled voltage $V_S$ is initially low, approximately 0 volts, and increases as $V_2$ is sampled. The operational amplifier 205 compares $V_S$ to $V_R$, the voltage produced by the reference circuit 206. As long as $V_S$ is less than $V_R$, the output voltage of the operational amplifier (VCP) is relatively low, thereby allowing p-channel transistor 207 to become more highly conducting. Therefore, the voltage at the source of p-channel transistor 208 is relatively high, allowing transistor 208 to supply a higher positive drive voltage to the gate of transistor 202. This high drive capability causes transistor 202 to conduct relatively heavily, so that Iout, and hence $V_2$, are relatively large. This relatively large value of $V_2$ is again sampled by the sample-and-hold circuit 204, and fed back as before, until the value of $V_S$ across capacitor $C_1$ increases to approximate the voltage $V_R$ across capacitor $C_2$. When equilibrium occurs, the voltage VCP from the operational amplifier 205 reaches a steady-state value, and hence the waveforms of $V_1$, $V_2$, $V_3$, and $I_{out}$ reach steady-state values.

However, the steady-state values of these voltages depend upon the fabrication processing conditions that were used to make the integrated circuit. In addition, they depend upon the power supply voltage and temperature of the integrated circuit during operation. For example, when the power supply voltage ($V_{DD}$) increases, or when the temperature of the integrated circuit decreases, the speed of operation of the buffer tends to increase. Similarly, an integrated circuit fabricated by a "fast" fabrication process results in a relatively higher speed operation. The best-case fast conditions may be illustrated by waveform 40 of FIG. 4, which shows the voltage $V_2$ as a function of time after the CLOCK goes low at time 0. Alternatively, decreases in the power supply voltage, or increases in operating temperature, or a "slow" fabrication process all tend towards a decrease in the speed of operation of the buffer. The waveform of $V_2$ resulting from worst-case slow conditions may be illustrated by 41 in FIG. 4. Note that in practice, some of the factors may tend in one direction, while others tend in the other direction, so that the waveform of $V_2$ typically lies between curves 40 and 41.

Figure 3:
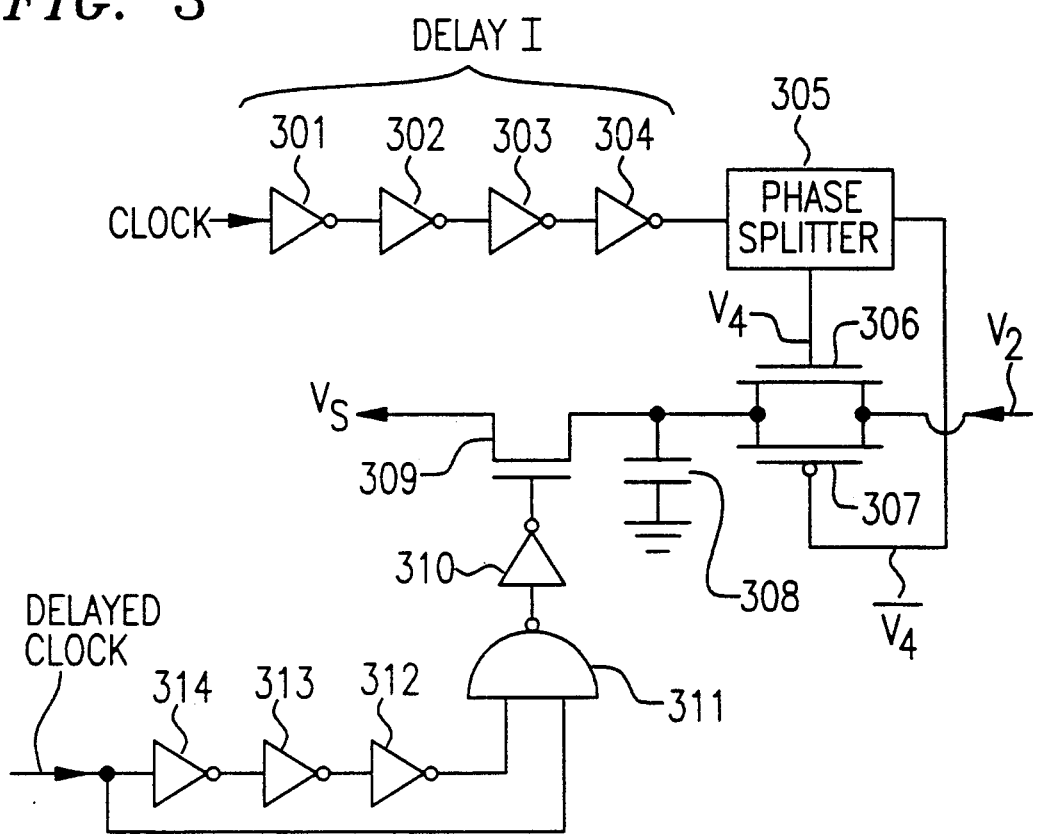
FIG. 3 shows in detail the sample-and-hold circuit of FIG. 2.
Figure 4:
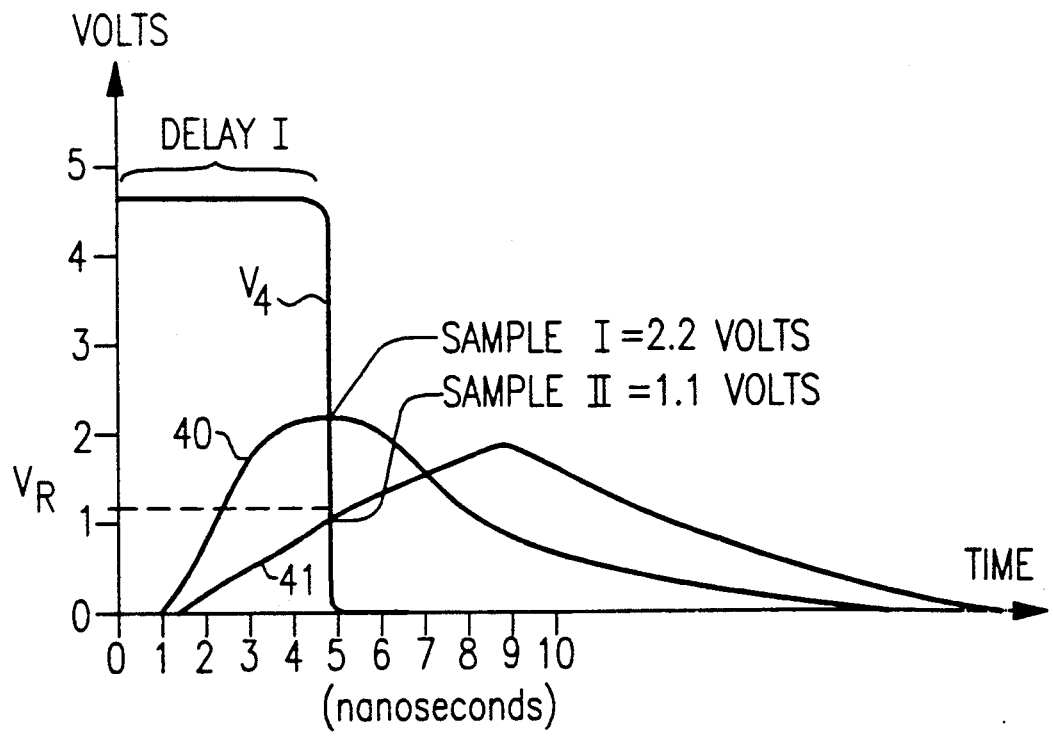
FIG. 4 shows an illustrative voltage waveform.

The operation of the circuitry of FIGS. 2 and 3 may be more completely understood by reference to FIG. 4. At time 0, the CLOCK signal goes low, and the voltage $V_4$ remains at an initially high value until the "DELAY I" time period provided by inverters 301 . . . 304. After this delay, illustratively about 4.5 nanoseconds, the voltage $V_4$ falls so as to cut off conduction through pass transistor 306 when the value of $V_4$ approximates the value of $V_2$ on the source of transistor 306. (Similarly, $\overline{V}_4$ rises after "delay I" to cut off conduction of pass transistor 307.) For example, the "Sample I" is shown at the time $V_4$ equals the value of $V_2$ in the first illustrative discharge waveform 40. This occurs at about 2.2 volts, which in the illustrative case yields a value of VCP of approximately 0 volts. This low value of VCP tends to slow down the fall time of the buffer in FIG. 1, thereby at least partially compensating for the best-case fast conditions. The "Sample II" is shown at the time $V_4$ equals the value of $V_2$ in the second illustrative discharge waveform 41. This occurs at about 1.1 volts, which yields a value of VCP of approximately 1.5 volts. This high value of VCP tends to speed up the fall time of the buffer in FIG. 1, thereby at least partially compensating for the worst-case slow conditions. Hence, the inventive circuitry yields the desired speed compensation.

In a typical circuit implementation of the inventive technique, the reference circuit 206 is a band-gap reference, which generates a DC voltage that is relatively constant with respect to changes in power supply voltage, temperature, and integrated circuit fabrication processing variations. In the case of silicon technology, the voltage from a band-gap reference is about 1.13 volts, shown as $V_R$ in FIG. 4. However, the voltage from a band-gap reference may be scaled by a voltage mirror to a different value, according to circuit techniques known in the art. Although a resistor (R) has been shown above as the impedance element for developing the voltage $V_2$, an inductor may alternatively be used, or a combination thereof. The impedance element may be located on the integrated circuit where the buffer is formed, or externally thereto. The CLOCK and DELAYED CLOCK signal may conveniently be generated by a ring oscillator circuit located on the same integrated circuit as the output buffer and the reference buffer, if desired. For example, a ring oscillator having 17 stages and operating with a 1000 nanosecond period may serve to generate the CLOCK signal. A DELAYED CLOCK may be then obtained by tapping the ring oscillator one stage after the CLOCK signal tap, obtaining a delay of 60 nanoseconds with respect to the CLOCK. Alternatively, externally-generated periodic (i.e., clock) signals may be used.

The foregoing circuitry generates the control voltage VCP, as used in the circuitry of FIG. 1. The control voltage VCN may be generated in a similar manner by circuitry that largely duplicates FIG. 2. However, in that case, the reference capacitor $C_{ref}$ is initially discharged to near 0 volts, and its charging rate toward $V_{DD}$ is then measured by measuring the voltage across a resistor placed in series with the source lead of a p-channel charging transistor. Alternatively, the voltage VCN may be derived from VCP by a voltage mirror that is centered around the mid-point of the power supply voltage (i.e., $V_{DD}/2$), according to circuit techniques known in the art. Then, as VCP increases with respect to $V_{SS}$, VCN decreases from $V_{DD}$ a comparable amount. Such a derived value of VCN actually tracks the characteristics of the n-channel transistor (e.g., 202) rather than a p-channel device. However, that is accurate enough for many application, considering that most circuit noise is due to the n-channel devices in present-day CMOS technologies.

The reference buffer of FIG. 2 may be scaled-down with respect to the size of the buffer in FIG. 1 that drives the actual load ($C_{load}$). That is, transistors 201 and 202 may be scaled-down with respect to 100 and 101, respectively. The reference load capacitor $C_{ref}$ is then typically also scaled-down with respect to the actual load capacitance $C_{load}$. Such scaling conserves integrated circuit area, and also reduces the power required to operate the reference circuit. The control voltages VCN and VCP may be used to control the speed of buffers other than the type shown in FIG. 1. For example, buffers having n-channel transistors for both the pull-up and pull-down devices are known in the art, and may advantageously use the inventive technique. Also, both the pull-up and pull-down transistors in the reference buffer (201 and 202) may be n-channel devices. While field effect devices are shown herein, the present technique may alternatively be implemented with bipolar devices, or with mixed device types in a BICMOS type of circuit. Also, the buffer may include only a pull-down output device (or alternatively only a pull-up output device), with an external resistor or other device providing the pull-up (or alternatively pull-down) function. As is apparent, the output load driven by the buffer may be supplied externally to the integrated circuit on which the buffer is formed, or may be used internally, as with a clock driver or other type of circuit. Still other variations are possible.

I claim:

1. An integrated circuit having a buffer for driving an output load at a switching speed, and means for generating a control signal that maintains said switching speed relatively more constant with respect to at least one of the factors selected from the group consisting of: temperature, power supply voltage, and fabrication process speed;

characterized in that said means for generating a control current comprises:
a reference buffer controlled by a periodic signal for supplying a drive current to a reference load;
means for sampling the magnitude of the drive current to said reference load to obtain a sampled drive signal;
and means for deriving said control signal from said sampled drive signal.

2. The integrated circuit of claim 1 wherein said reference buffer comprises a pull-up transistor for charging a reference capacitor and a pull-down transistor for discharging said reference capacitor, whereby said sampled drive signal is derived from the current that flows from said capacitor during either said charging or discharging.

3. The integrated circuit of claim 2 wherein said sampled drive signal is derived from said current by means of an impedance connected in series between a power supply conductor and either one of said pull-up transistor and said pull-down transistor.

4. The integrated circuit of claim 3 wherein said impedance substantially comprises a resistance.

5. The integrated circuit of claim 1 wherein said means for sampling the magnitude of the drive current to the reference load comprises a sample-and-hold circuit.

6. The integrated circuit of claim 1 wherein said means for deriving said control signal from said sampled drive signal comprises:
means for generating a constant-magnitude reference signal;
means for comparing the magnitude of said sampled drive signal to said constant-magnitude reference signal; and
means for feeding the control signal back to said reference buffer so as to cause said sampled magnitude to reach a steady-state value.

7. The integrated circuit of claim 6 wherein said means for generating a constant-magnitude reference signal is a band gap voltage reference.

8. The integrated circuit of claim 6 wherein said means for comparing is an operational amplifier.

9. The integrated circuit of claim 8 wherein said means for feeding the control voltage back to said reference buffer causes said sampled drive signal to equilibrate with respect to said constant-magnitude reference signal at the inputs of said operational amplifier.

10. The integrated circuit of claim 6 wherein said reference buffer comprises a pull-up transistor for charging a reference capacitor and a pull-down transistor for discharging said reference capacitor;
  wherein said magnitude of said drive current is derived from the current that flows from said capacitor during said discharging by means of a resistor connected in series between said pull-down transistor and a power supply conductor.

11. The integrated circuit of claim 10 wherein said means for sampling the magnitude of the drive current to said reference load comprises a sample-and-hold circuit connected to said resistor.

12. An integrated circuit having a buffer comprising a pull-up transistor for raising the voltage on an output load during a rise time, and an n-channel pull-down transistor for reducing said voltage during a fall time; and means for generating a control voltage that maintains the fall time of said pull-down transistor relatively more constant with respect to at least one of the factors selected from the group consisting of: temperature, power supply voltage, and fabrication process speed,
  characterized in that said means for generating a control voltage comprises:
  a reference buffer comprising an n-channel pull-down transistor that discharges a reference capacitor by allowing current to flow from said capacitor through an impedance, thereby producing a voltage across said impedance;
  a sample-and-hold circuit for sampling the magnitude of said voltage in order to produce a sampled voltage;
  a band-gap reference for generating a constant-magnitude reference voltage;
  a band-gap reference for generating a constant-magnitude voltage;
  an operational amplifier for comparing the magnitude of said sampled voltage to said constant-magnitude reference voltage in order to generate said control voltage; and means for feeding the control voltage back to said reference buffer so as to cause said sampled magnitude to reach a steady-state value.

13. The integrated circuit of claim 12 wherein said impedance substantially comprises a resistance.

14. The integrated circuit of claim 12 further comprising means to maintain the rise time of said pull-up transistor relatively more constant with respect to at least one of the factors selected from the group consisting of: temperature, power supply voltage, and fabrication process speed.

15. A method of operating an integrated circuit buffer that drives an output load at a switching speed, including the step of generating a control signal that maintains said speed relatively more constant with respect to at least one of the factors selected from the group consisting of: temperature, power supply voltage, and fabrication process speed,
  characterized in that said generating a control signal comprises:
  driving a refenence load with a drive current generated by a reference buffer;
  sampling the magnitude of the drive current to said reference load to obtain a sampled drive signal; and
  deriving said control signal from said sampled drive signal.

16. The method of claim 15 wherein said reference load is a reference capacitor, said reference buffer comprises a reference pull-up transistor and a reference pull-down transistor, and
  further comprising the step of deriving said sampled drive signal by flowing a current from said reference capacitor through an impedance during either the charging of said reference capacitor by said reference pull-up transistor. or the discharging of said reference capacitor by said reference pull-down transistor.

17. The method of claim 16 wherein said impedance substantially comprises a resistance.

18. The method of claim 15 wherein said sampling the magnitude of the drive signal to the reference load is accomplished by means of a sample-and-hold circuit.

19. The method of claim 15 wherein said deriving said control signal from said sampled drive signal is accomplished by steps comprising:
  generating a constant-magnitude reference signal;
  comparing the magnitude of said sampled drive signal to said constant-magnitude reference signal in order to generate said control voltage; and
  feeding the control voltage back to said reference buffer so as to cause said sampled magnitude to reach a steady-state value.

20. The method of claim 19 wherein said generating a constant-magnitude reference current is accomplished by means of a band gap voltage reference.

21. The method of claim 16 wherein said comparing is accomplished by means of an operational amplifier.

22. The method of claim 21 wherein said feeding the control voltage back to said reference buffer causes said sampled drive signal to equilibrate with respect to said constant-magnitude reference signal at the inputs of said operational amplifier.

* * * * *